United States Patent
Zambuto et al.

[11] 4,019,069
[45] Apr. 19, 1977

[54] BASEBAND VIDEO SWITCH

[75] Inventors: Domenic A. Zambuto, Norwell, Mass.; Gordon Champion, Deep River, Conn.

[73] Assignee: GTE Laboratories Incorporated, Waltham, Mass.

[22] Filed: Apr. 2, 1976

[21] Appl. No.: 673,023

[52] U.S. Cl. .............................. 307/256; 307/270; 307/241

[51] Int. Cl.$^2$ ...................................... H03K 17/74

[58] Field of Search ... 307/270, 256, 257, 241–243

[56] References Cited
UNITED STATES PATENTS

| | | | |
|---|---|---|---|
| 3,230,397 | 1/1966 | Linder | 307/243 |
| 3,373,298 | 3/1968 | Tompkins et al. | 307/256 |
| 3,479,527 | 11/1969 | Michon | 307/257 |
| 3,922,570 | 11/1975 | Equchi et al. | 307/270 |

*Primary Examiner*—Stanley D. Miller, Jr.
*Assistant Examiner*—B. P. Davis
*Attorney, Agent, or Firm*—Irving M. Kriegsman; Robert A. Seldon; Leslie J. Hart

[57] ABSTRACT

The signal path between the input and output of a baseband video switch has a control point to which a signal representative of a switch control signal and a switchable constant current source are coupled. A pair of diodes and a switchable, high impedance buffer are disposed in series between the input terminal and the control point. A diode and a switchable driver are connected in series between the control point and the output terminal. A biasing arrangement responsive to the control signal biases the control point, and the current source. When the control signal is of one level, the diode junctions disposed in the path of the video signal are reverse-biased and the current source is off. When the control signal is of the other level, the diode junctions are forward-biased and the constant current source is on. A resistor load coupled between the input terminal and the control point provides a load for the signal when the switch is off.

6 Claims, 1 Drawing Figure

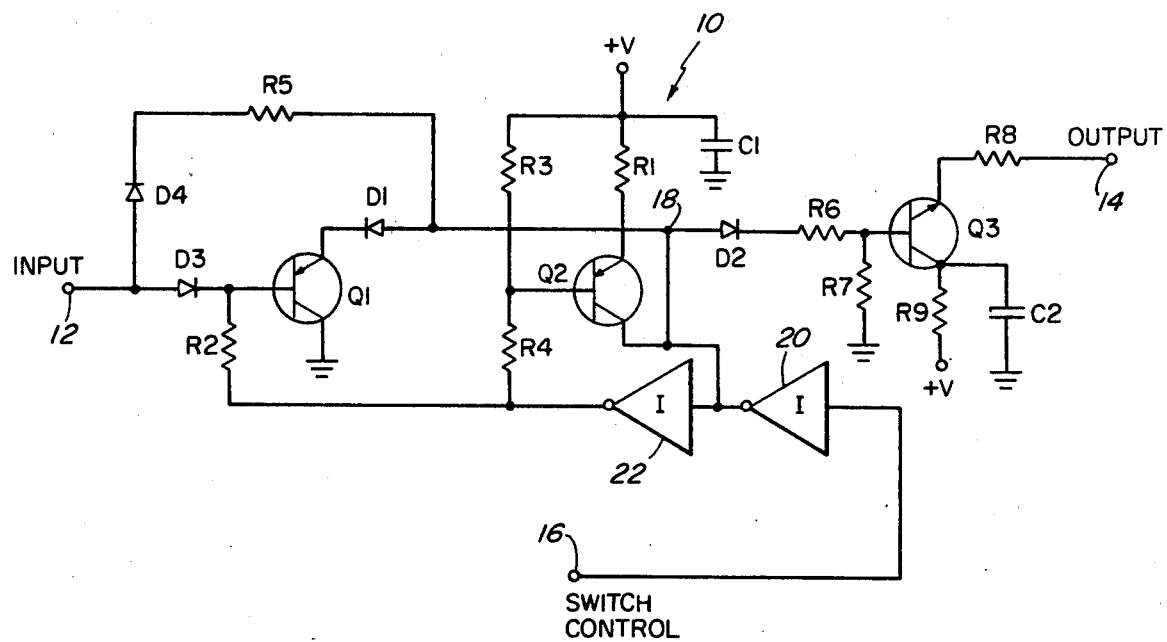

BASEBAND VIDEO SWITCH

BACKGROUND OF THE INVENTION

The present invention relates to electronic switches and, more specifically, to an electronic switch for use in switching a signal in the baseband video range of frequencies.

Several applications exist where it is necessary to switch baseband video signals. For example, such switching capability is utilized in the distribution of color television baseband video signals from video sources, such as a video tape player or an off-the-air tuner, to a number of remote monitoring locations. The distribution system may be used as a remote access, audio/video information retrieval system in schools or in industrial training facilities.

The heart of the distribution system is a switching matrix comprising a plurality of switches interconnected so as to switch any one of a plurality of input signals to any one of a plurality of outputs. Various types of switches are known, including diode arrays, silicon-controlled rectifiers, field-effect transistors, traditional reed relays, solid state relays, and analog switches. However, such conventional switches have not been found to be suited for such switching applications from both cost effectiveness and perfomance points of view.

SUMMARY OF THE INVENTION

It is an object of the present invention to provide an improved baseband video switch.

It is an additional object of the present invention to provide a baseband video switch having improved OFF isolation characteristics, while being economical to manufacture.

It is still an additional object of the present invention to provide a baseband video switch having a load impedance in the OFF condition which is substantially equal to the output impedance of the switch in the ON condition.

According to the present invention, a baseband video switch has first and second oppositely poled diodes connected in series in which the junction forms a control point. A third diode and a switchable, high impedance buffer are coupled in series between the input of the switch and the side of the first diode opposite the control point. A switchable driver means is connected between an output of the switch and the side of the second diode opposite the control point. The switch also includes a switchable transistorized constant current source which supplies a constant level of current to the control point when the diodes are in a conductive state. A biasing arrangement, responsive to a control having first and second voltage levels, biases the diodes, buffer, driver and current source into conduction when the control signal is of the first level and biases the same elements into non-conduction when the control signal is of the second level. Preferably, the switch also includes a resistive load coupled between the control point and the input for properly terminating the signal when the switch is in the OFF state.

BRIEF DESCRIPTION OF THE DRAWING

In the drawing:

The sole FIGURE, of the drawing is a schematic diagram of the baseband video switch according to the present invention.

DESCRIPTION OF PREFERRED EMBODIMENT

In an exemplary embodiment of the present invention, as illustrated in te Figure, there is provided a baseband video switch, represented generally by the reference numeral 10. The switch 10 has input terminals 12 for receiving a baseband video signal from a source (not shown), such as an off-the-air tuner or a video tape player. A baseband video signal can range in frequency from dc to 4.5 MHz. An output terminal of the switch 10 is represented by the reference numeral 14. The input 12 and output 14 are both referenced with respect to ground. The switch 10 has first and second oppositely poled diodes D1 and D2 connected in series. A junction 18 between the diodes D1 and D2 forms a control point for the switch 10. A third diode D3 and a switchable, transistorized buffer Q1 are connected in series between the input terminal 12 and the side of the first diode D1 which is opposite to the control point 18. The diodes D1 and D3 are poled oppositely with respect to each other. Regarding the transistor Q1, the emitter is coupled to the diode D1, its base is coupled to the diode D3, and the collector is coupled to ground.

A switchable, constant current source is provided for supplying a constant level of current to the control point 18 when the switch 10 is in an ON state. This constant current source includes a transistor Q2 whose collector is coupled to the control point 18. A voltage source +V, which in the example is +12 volts, establishes the emitter bias of Q2 via a resistor R1. A capacitor C1 coupled between +V and ground removes transients which may be present in the voltage +V. The switch 10 includes a biasing arrangement responsive to a control signal at 16 for controlling the state of the switch. An inverter 20 receives the control signal. The inverted output of the inverter 20 is coupled to the control point 18, to the collector of transistor Q2 and to the input of a second inverter 22. The output of inverter 22 controls the base biasing of the transistor Q1 via a resistor R2 and the base biasing of the transistor Q2 via the voltage divider network comprising resistors R3 and R4. Preferably, the inverters 20 and 22 are open-collector inverters.

The switch 10 also had a load circuit including a diode D4 and a resistor R5 which are coupled in series from the input terminal 12 to the control point 18. A switchable driver including a transistor Q3 is coupled between the output 14 and the diode D2. The base biasing of the transistor Q3 is established by the control point voltage and the combination of resistors R6 and R7. The sum of R6 and R7 is substantially equal to the resistive load R5. The output of the driver is taken from one side of a resistor R8 whose other side is coupled to the emitter of the transistor Q3. The collector of the transistor Q3 is coupled to the source of voltage +V via a resistor R9. A capacitor C2 is coupled between ground and the collector of transistor Q3.

The operation of the switch 10 is summarized below. In the circuit, the magnitude of +V is +12 volts and the logical levels (1 and 0) of the control signal are +12 volts and zero volts, respectively. In the OFF state, there is a logical 1 at the input of inverter 20 and a logical 0 at the output of inverter 20. The control point 18 is, therefore, clamped to ground. The output of inverter 22 is pulled up to a high positive voltage, +12 volts, thereby reverse-biasing the diode D3 and shutting off transistors Q1 and Q2. Since diode D2 is also reversed-biased, transistor Q3 is deprived of base current and is shut off. Current will flow through R5 and the diode D4 which comprise a proper termination for the signal when the switch is in its OFF state. This helps to eliminate switching bounce since the loading effect of the switch on the source of the baseband video signal is the same whether the switch is on or off. Summarizing the OFF state then, there are actually five reverse-biased diode junctions isolating the input 12 from the output 14; these junctions include from left to right D3, Q1 base-emitter junction, D1, D2 and Q3 base-emitter junction. In addition, the current source (i.e., transistor Q2) is shut off and the signal path at the junctions of diodes D1 and D2 is clamped to ground. This accounts for the excellent OFF isolation of the switch.

To turn on the switch, a logical 0 is applied to the input 16 of inverter 20, putting +12 volts at the control point 18 and zero volts at the output of inverter 22. This forward-biases all five diode junctions. In the ON condition, the signal path from input to output is through D3, Q1 base-emitter junction, D1, D2, R6, Q3 base-emitter junction and R8. Also, transistor Q2 is conducting and provides a constant current to the control point.

The following comprises the identification and value of the various components comprising the switch 10 shown in the exemplary embodiment.

| R1 | 270 ohms | C1 | 0.1 µf |
|----|----------|----|--------|
| R2 | 1.1K ohms | C2 | 100µf |
| R3 | 5.6K ohms | Q1 | 2N3905 |
| R4 | 4.3 ohms | Q2 | 2N3905 |
| R5 | 1.1K ohms | Q3 | 2N2218 |
| R6 | 150 ohms | Inverter 20 | RCA 7406 |
| R7 | 1K ohms | Inverter 22 | RCA 7406 |
| R8 | 75 ohms | D1-D4 | 1N4148 |
| R9 | 180 ohms | | |

The embodiment of the present invention is intended to be merely exemplary and those skilled in the art shall be able to make numerous variations and modifications of it without departing from the spirit and scope of the present invention. All such variations and modifications are intended to be within the scope of the present invention as defined by the appended claims.

We claim:

1. A baseband video switch including:
   a. first and second oppositely poled diodes connected in series, the junction between the diodes forming a control point for the switch,
   b. a third diode and a switchable, high impedance buffer means connected in series between an input terminal for the baseband video signal and the side of the first diode opposite to the control point.
   c. a switchable driver means connected between the side of the second diode opposite to the control point and an output terminal for the baseband video signal,
   d. a switchable, transistorized constant current source means for supplying a constant level of current to the control point where the diodes are in a conductive state, and
   e. means responsive to a control signal having first and second voltage levels for biasing the diodes, and the buffer means, the driver means and current source means into conduction when the control signal is of the first level and for biasing the diodes, the buffer means, the driver means and current source means into non-conduction when the control signal is of the second level.

2. The switch according to claim 1 wherein the third diode is poled oppositely with respect to the first diode and one side of the third diode is coupled to the input terminal.

3. The switch according to claim 2 wherein the buffer means includes a first transistor having a base to emitter junction coupled between the first and third diodes in the same current conduction sense as the first diode and wherein the biasing means includes means for biasing the base to emitter junction of the first transistor.

4. The switch according to claim 1 further including means for matching the impedance of the switch in the non-conductive state to the impedance of the driver means in the conductive state.

5. The switch according to claim 4 wherein the matching means includes a resistor coupled between the input terminal and the control point.

6. The switch according to claim 5 further including a fourth diode coupled in series with the resistor to prohibit current flow through the resistor when the switch is in an OFF condition.

* * * * *

UNITED STATES PATENT OFFICE
CERTIFICATE OF CORRECTION

Patent No. 4,019,069         Dated April 19, 1977

Inventor(s) Domenic A. Zambuto et al.

It is certified that error appears in the above-identified patent and that said Letters Patent are hereby corrected as shown below:

Column 2, line 4, delete "te", and insert --the--;

Column 3, line 1, delete "reversed-biased", and insert --reverse-biased--;

Column 4, line 8, delete ".", after "period", and insert --,--;

line 19, delete "and".

Signed and Sealed this thirtieth Day of August 1977

[SEAL]

Attest:

RUTH C. MASON
Attesting Officer

C. MARSHALL DANN
Commissioner of Patents and Trademarks